US012594571B2

(12) United States Patent
Liao et al.

(10) Patent No.: US 12,594,571 B2
(45) Date of Patent: Apr. 7, 2026

(54) METHOD AND APPARATUS FOR REDUCING SOLVENT CONSUMPTION

(71) Applicant: TAIWAN SEMICONDUCTOR MANUFACTURING COMPANY, LTD., Hsinchu (TW)

(72) Inventors: Chun-Wei Liao, Taoyuan (TW); Tung-Hung Feng, Hsinchu (TW); Hui-Chun Lee, Hsinchu (TW); Shih-Che Wang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 510 days.

(21) Appl. No.: 17/372,148

(22) Filed: Jul. 9, 2021

(65) Prior Publication Data

US 2023/0010749 A1 Jan. 12, 2023

(51) Int. Cl.
*B05B 15/58* (2018.01)
*G03F 7/26* (2006.01)

(52) U.S. Cl.
CPC ............... *B05B 15/58* (2018.02); *G03F 7/26* (2013.01)

(58) Field of Classification Search
None
See application file for complete search history.

(56) References Cited

U.S. PATENT DOCUMENTS

| | | | | |
|---|---|---|---|---|
| 3,967,920 | A * | 7/1976 | Hill | B05B 12/1418 417/313 |
| 6,500,242 | B2 * | 12/2002 | Fu | B01D 19/0063 96/194 |
| 2004/0115949 | A1 * | 6/2004 | Chen | H01L 21/67109 438/745 |
| 2008/0199596 | A1 * | 8/2008 | Nakagawa | B05B 15/50 118/712 |
| 2012/0241469 | A1 * | 9/2012 | Takeishi | F04B 9/00 222/1 |
| 2015/0048035 | A1 * | 2/2015 | Liao | B01D 35/02 210/120 |
| 2015/0328650 | A1 * | 11/2015 | Carcasi | B01D 19/0031 222/145.5 |
| 2016/0361668 | A1 | 12/2016 | Wang | |
| 2020/0174372 | A1 | 6/2020 | Hsu et al. | |

* cited by examiner

*Primary Examiner* — Charles Capozzi
(74) *Attorney, Agent, or Firm* — STUDEBAKER BRACKETT PLLC

(57) ABSTRACT

A solution dispense system for a semiconductor manufacturing process includes a longer circulation loop in order to minimize the idle section from resist pump to dispense nozzle. A t-valve and control valve are disposed close to the nozzle in order to decrease the idle section and reduce material consumption.

20 Claims, 7 Drawing Sheets

Figure 6:
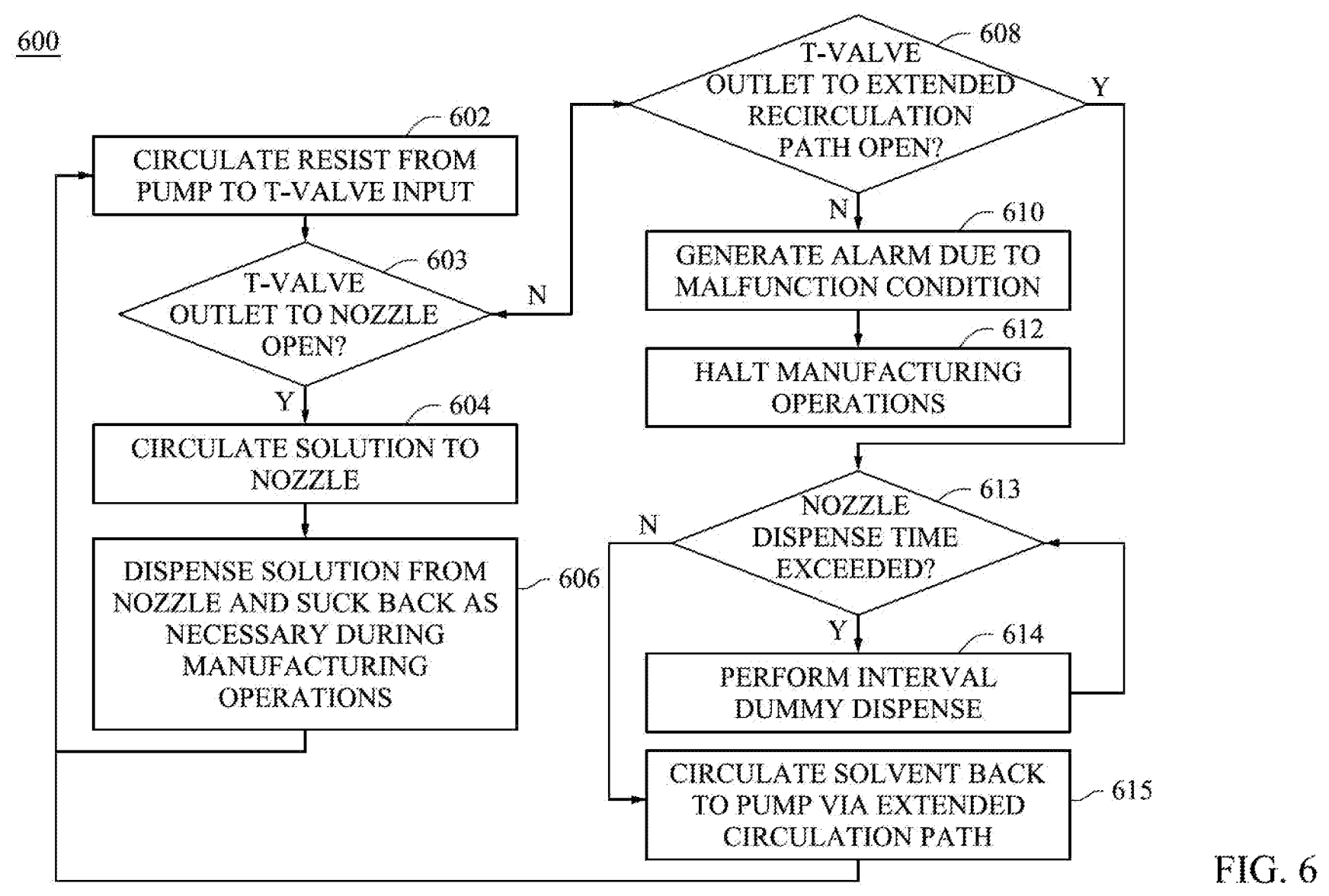

CIRCULATE RESIST FROM PUMP TO T-VALVE INPUT ~ 602

T-VALVE OUTLET TO NOZZLE OPEN? ~ 603

CIRCULATE SOLUTION TO NOZZLE ~ 604

DISPENSE SOLUTION FROM NOZZLE AND SUCK BACK AS NECESSARY DURING MANUFACTURING OPERATIONS ~ 606

T-VALVE OUTLET TO EXTENDED RECIRCULATION PATH OPEN? ~ 608

GENERATE ALARM DUE TO MALFUNCTION CONDITION ~ 610

HALT MANUFACTURING OPERATIONS ~ 612

NOZZLE DISPENSE TIME EXCEEDED? ~ 613

PERFORM INTERVAL DUMMY DISPENSE ~ 614

CIRCULATE SOLVENT BACK TO PUMP VIA EXTENDED CIRCULATION PATH ~ 615

METHOD AND APPARATUS FOR
REDUCING SOLVENT CONSUMPTION

BACKGROUND

Photoresist solutions are used in many semiconductor processes. Photoresist layers are often formed to selectively mask an underlying semiconductor substrate from a semiconductor manufacturing operation. Due to its being light sensitive, photoresist is used as a spin-on masking layer that can be selectively patterned using, for example, a photolithography process to form intricate patterns on a semiconductor substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 6 is a flow chart of a recirculation process in accordance with some embodiments.

DETAILED DESCRIPTION

Figure 1:
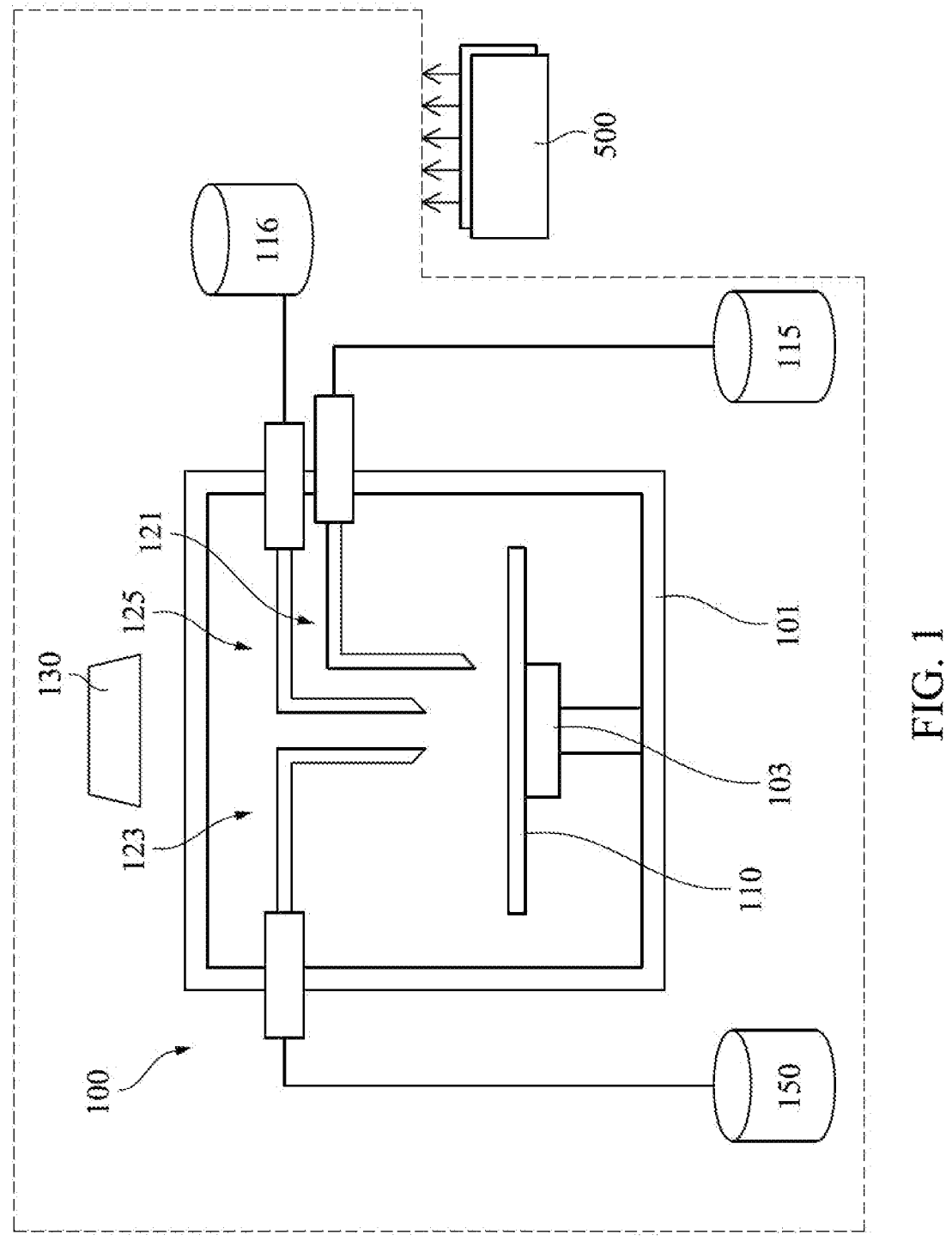
FIG. 1 is a wafer processing apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In various embodiments herein, the various directional valves are unidirectional valves that allow solution flow in only one direction there-through. In various embodiments herein, the terms solvent and solution are used interchangeably.

In a resist coating and/or developing apparatus, pump systems or dispensing systems provide photoresist or other solutions to semiconductor manufacturing processes and operations. Steps must be taken to keep the photoresist free of contamination and crystallization. Particles greater than 0.3 micrometers ($\mu$m) in the photoresist can create a non-uniform coating on manufactured semiconductor devices. Furthermore, particles can also "short-out" a device when they land between the features. Defective devices cannot be sold and must be scrapped, thereby impacting the profitability of a manufacturing facility. These contaminants can be introduced through the raw materials, as well as the components in the manufacturing system such as pumps, fittings, valves, piping, and transfer drum, particularly when the photoresist is idle or under lower pressure. Constant circulation through the pump system is therefore required in order to minimize particle generation and maximize defect control. This constant circulation requires a regular dispense of photoresist out of the nozzle, known as an interval dummy dispense, even when the manufacturing process is otherwise idle or photoresist is not presently needed. As the interval dummy dispense frequency increases, more photoresist consumption and waste necessarily occurs, thereby further increasing manufacturing costs.

The present disclosure relate to a pump system for a photoresist coater to reduce photoresist consumption and particle generation. The technologies disclosed herein can be applied to other solution dispensing system, such as a photoresist developer for dispensing a developer solution, a wet etching or a wet cleaning apparatus for dispensing an acid or alkaline solution or an organic solvent.

FIG. 1 is a schematic view of an apparatus 100 according to various embodiments. In some embodiments, the apparatus 100 is a lithography or photolithography apparatus for processing a workpiece (e.g., a wafer or substrate), in whole or in part, by advanced manufacturing processes. The embodiments disclosed herein will be described in detail with respect to a lithography apparatus 100, which is used for deep ultraviolet (DUV) lithography processes, extreme ultraviolet (EUV) lithography processes, e-beam lithography processes, x-ray lithography processes, and/or other lithography platforms in various embodiments. One of ordinary skill in the art understands that one or more of the foregoing features are utilized together within the apparatus 100 shown in FIG. 1 in some embodiments.

In various embodiments, the lithography apparatus 100 includes a housing or an enclosure 101 in which a substrate holder 103 is disposed. The substrate holder 103 is configured to hold a substrate 110 and, in some embodiments, to rotate the substrate 110 at various speeds. Further, an ultraviolet (UV) light source 130 is disposed inside or outside the housing 101 when the apparatus is a photoresist developing apparatus, in some embodiments.

In various embodiments, the apparatus 100 includes a fluid nozzle 123 to dispense and deposit a chemical solution or solvent (i.e., a photoresist) from a bottle or container or a facility fluid supply 150 onto a wafer or workpiece during a lithography, cleaning or etching process. Although the apparatus 100 will be described in detail with respect to the use of photoresist, one of ordinary skill will readily appreciate that other solutions or solvents may likewise be used in various embodiments. In some embodiments, solutions used in a photoresist patterning process include positive tone developer (PTD), negative tone developer (NTD), reduce resist consumption (RRC) solvent and other solvents. In some embodiments, the apparatus 100 includes one or more additional nozzles, such as a cleaning nozzle 121 configured to dispense a cleaning solution from a cleaning fluid source 115, and a water nozzle 125 configured to dispense deionized water from a water source 116, onto the wafer 110 and/or to clean the fluid nozzle 123 during an idle period and the like. In some embodiments, one or more of the nozzles 121, 123 and 125 are spin nozzles and are movable in horizontal and vertical directions with respect to the substrate holder 103.

At least a part of the operations of the apparatus 100 is controlled by one or more controllers 500, which are each a computer system including one or more processors and appropriate data storage in some embodiments. In various embodiments, the controller 500 controls the operations of, for example, the substrate holder 103, the nozzles 121, 123 and 125, components controlling fluid flows of the circulated solutions, monitoring of various sensors, alarming of abnormal conditions or functions, and operation of the UV light source 130.

The substrate 110 includes a semiconductor wafer or a glass substrate in various embodiments. In various embodiments, a semiconductor wafer is used. In those embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide(GaInP)), or the like. In some embodiments, the substrate 110 includes a silicon-on-insulator (SOI) structure.

In some embodiments, one or more layers are disposed on the substrate 110. In some embodiments, the one or more of the layers are patterned. In other embodiments, the one or more layers have no patterns. In some embodiments, the one or more layers include an insulating material layer, a conductive material layer, an organic material layer, an inorganic material layer, a metallic layer or any combination thereof.

In various embodiments, a chemical solution is applied from the nozzle 123 onto the surface of the substrate 110, which may contain or generate particles. The particles are any kind of particles made of, for example, organic materials, inorganic materials, dielectric materials, ceramic materials and/or metal or metallic materials in some embodiments. The particles include nanoparticles having sizes of less than about fifty nanometers (nm) in some embodiments. In certain embodiments, the size of the particles ranges from about 0.1 nm to about 40 nm. Such particles adhere on the surface of the substrate 110 by physical absorption by van der Waals force and/or chemical absorption by chemical bonding. The chemical bonding includes hydrogen bonding and ionic bonding in some embodiments.

In various embodiments of a semiconductor manufacturing process, a fine circuit pattern is produced by uniformly applying photoresist, including a photosensitive material and a solvent, on a conductive metal film or an oxide film formed on the substrate 110. The photoresist, or other solution, is dispensed by the nozzle 123 using a spin-coating method, and then performing exposure, development, etching, and peeling processes in various embodiments. In some embodiments, the exposure process is implemented in such a manner that a desired pattern is finely exposed to a coating film using light of a short wavelength in the ultraviolet region. Thus, the process is very sensitive to external or internal contaminants.

To minimize the idle effect, which is known as a source of particle generation when the photoresist is idle or under too low a pressure, constant circulation of the photoresist through a solution dispensing system of the apparatus 100 is required. In various embodiments of a lithography track process, since manufacturing operations are not continuously performed, a high frequency interval dummy dispense is necessary to minimize the idle effect and maintain suitable wafer defect performance. As a result, high resist consumption is necessarily incurred, as large portions of photoresist is wasted in such dummy dispenses. It has been found that in some embodiments in semiconductor manufacturing processes that produce 1000 wafers per day, up to 35% of photoresist supplies have been wasted. In order to reduce the material wastes, overall consumption and resulting costs, a new circulation system for photoresist materials is introduced to the photolithography track.

Figure 2A:
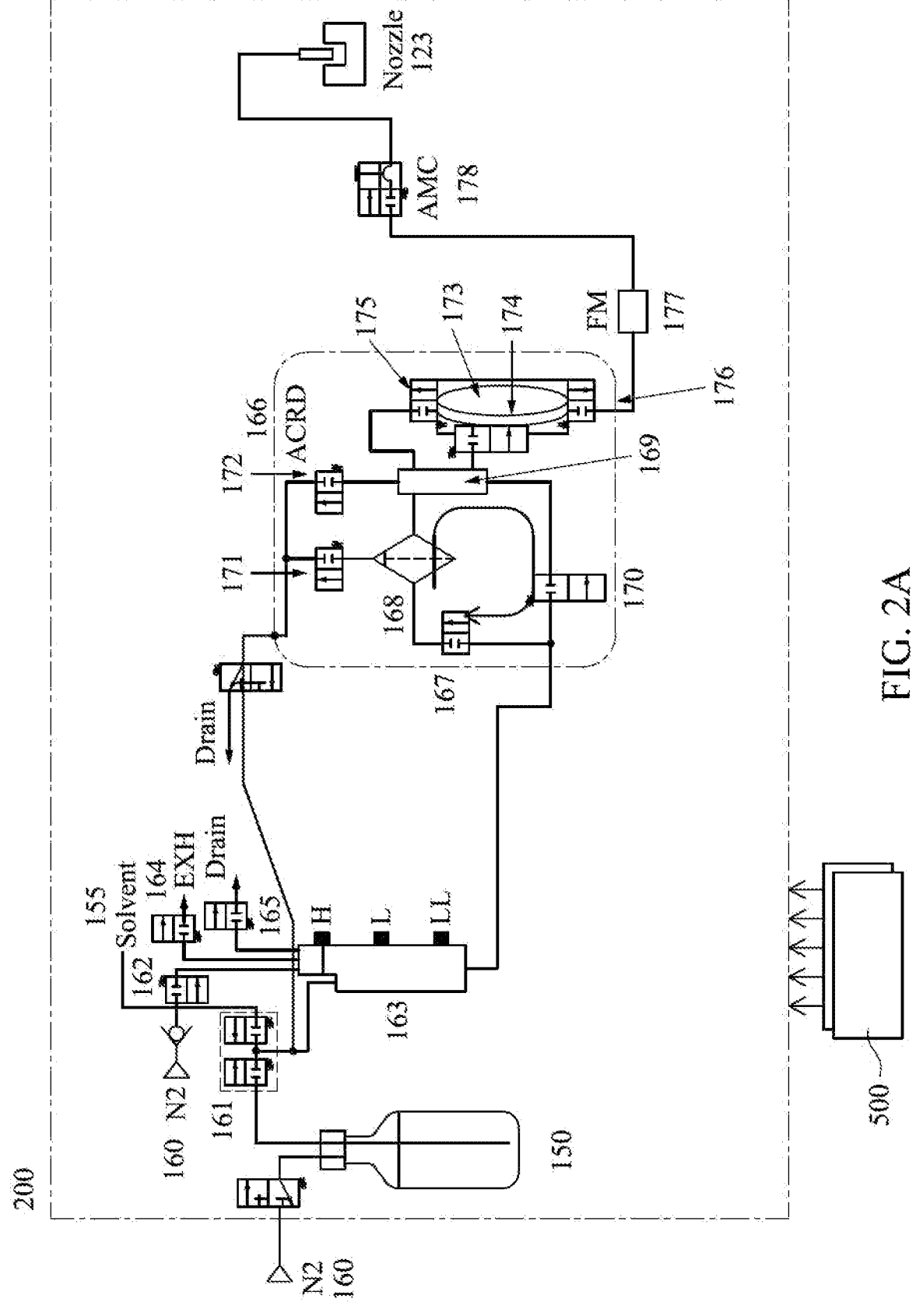
FIG. 2A is a detailed diagram of a first solvent circulation system in accordance with some embodiments.

FIG. 2A is a detailed diagram of a first solution dispensing system 200 that is provided with apparatus 100 in accordance with various embodiments. The first solution dispensing system 200 includes one or more conduits interconnecting the various elements described herein. In some embodiments, the solvent dispensing system 200 includes a solution storage 150 for storing a solution, solvent or other component used in a semiconductor manufacturing process performed by the apparatus 100. In some embodiments, the solution being stored is a photoresist or a photosensitive component of photoresist.

In various embodiments, a gas supply 160 with one or more valves is provided. In some embodiments, the gas supply 160 provides an inert or non-reactive gas, such a nitrogen ($N_2$). In some embodiments, the gas is used to force a flow of solution from the solution storage 150 to a buffer tank 163. In some embodiments, the solution passes through a controllable directional valve 161 disposed between the solution storage 150 and the tank 163. In some embodiments, the directional valve 161 may be closed by a controller 500 during abnormal operation, idle time, shut down, maintenance or the like of the apparatus 100.

In various embodiments, an auxiliary solvent supply 155 is provided. In some embodiments, the solvent provided by the auxiliary solvent supply 155 is mixed with the solution provided by the solution storage 150 to generate a photoresist solution for the manufacturing processes performed by the apparatus 100. In some embodiments, the auxiliary solvent supply 155 is provided for cleaning purposes. In some embodiments, the solvent passes through the controllable directional valve 161 disposed between the auxiliary solvent supply 155 and the tank 163 to clean the conduits in a maintenance operation. In various embodiments, the gas supply 160 also provides an inert or non-reactive gas to the tank 163 through the directional valve 161. In some embodiments, the gas is used to force a flow of solvent from the auxiliary solvent supply 155 to the tank 163.

In various embodiments, the gas supply 160 also provides an inert or non-reactive gas to the tank 163 through a directional valve 162. In some embodiments, the gas is used to force a flow of solution from the tank 163 to a downstream semiconductor manufacturing process performed by the apparatus 100 through one or more additional components described herein.

In various embodiments, the tank 163 receives the solution from solution storage 150. In some embodiments, the tank 163 also receives the solvent from auxiliary solvent supply 155. In some embodiments, the solvent and the solution are mixed in the tank 163 before being provided to the semiconductor manufacturing processes performed by the apparatus 100.

In some embodiments, the tank 163 includes an internal monitor for monitoring the level of solution presently in the tank 163 (e.g., a low level, a medium level and a high level). In some embodiments, the level is monitored by the controller 500 to determine normal or abnormal operating conditions based on the monitored solution level.

In some embodiments, a directional exhaust valve 164 is connected to the tank 163 in order to provide an exhaust for the inert or non-reactive gas provided to the tank 163. In some embodiments, the exhaust is used to maintain a pressure or range of pressures within the tank 163. In some embodiments, the directional exhaust valve 164 is controlled by the controller 500 during normal or abnormal operating conditions. For example, the controller 500 may control the directional exhaust valve 164 to maintain a desired pressure or range of pressures during normal operation and to purge the gas from the tank 163 through the exhaust when an abnormal operating condition is encountered.

In some embodiments, a directional drain valve 165 is connected to the tank 163 in order to provide access to a drain for the solution within to the tank 163. In some embodiments, the directional drain valve 165 is controlled by the controller 500 during normal or abnormal operating conditions. For example, the controller 500 may control the directional drain valve 165 to maintain a desired solution level during normal operation and to purge the solution from the tank 163 through the drain when an abnormal operating condition is encountered.

In various embodiments, during normal operation, the tank 163 provides the solution to an Advanced Compact Resist Dispense (ACRD) pumping system 166, which in turn pumps the solution to the semiconductor manufacturing processes performed by the apparatus 100. In some embodiments, an external recirculation loop is established between the ACRD pumping system 166 and the tank 163. In some embodiments, the ACRD pumping system 166 is connected to a drain at various locations as noted herein for draining the solution from the ACRD pumping system 166 during abnormal operating conditions, idle time, shut down, maintenance or the like of the apparatus 100.

In various embodiments, the ACRD pumping system 166 receives the solution from the tank 163 via a directional valve 167. In some embodiments, the directional valve 167 is controlled by the controller 500 to open or close during normal or abnormal operating conditions.

In various embodiments, the directional valve 167 provides the solution to a filter 168. In some embodiments, the solution is controlled to pass through the filter 168 at an appropriate pressure and an appropriate speed. If the solution were to pass through the filter 168 at too high a pressure, i.e., at a very high speed, foreign materials would not be sufficiently filtered from the solution. If the solution were to pass through the filter 168 at too low of a pressure, i.e., at a very slow speed, manufacturing productivity will be degraded and more crystallization and residues could be generated due to the slow fluidity. In various embodiments, the filter 168 includes a polar filter. In other embodiments, the filter 168 includes a non-polar filter.

In various embodiments, the solution then continues from the filter 168 to a circulating mechanism 169. In some embodiments, the circulating mechanism 169 is a small pump, impellor or pressure regulating device. In various embodiments, when the main pump 173 is idle (for example, when the semiconductor manufacturing process performed by the apparatus 100 is idle), the circulating mechanism 169 circulates the solution to the directional valve 170. In such embodiments, the directional valve 167, the filter 168, the circulating mechanism 169 and the directional valve 170 form an internal recirculation loop, also referred to as a pump return line, through which the solution is continuously recirculated to prevent degradation during idle times and the like.

In various embodiments, the filter 168 is connected to a directional valve 171 (sometimes referred to as a filter vent port) and the circulating mechanism 169 is connected to a directional valve 172 for removing or purging solution from the ACRD pumping system 166. In various embodiments, the solution is removed during an abnormal operation, an abnormal condition of the solution, idle time, shut down, maintenance or the like of the apparatus 100. In various embodiments, the directional valves 171, 172 are connected to a drain for draining the solution from the system 200. In various embodiments, the directional valves 171, 172 are connected to the tank 163 in order to form the external circulation loop as previously described, and return the solution to the tank. In various embodiments, the directional valves 171, 172 provide the solution selectively to the drain or the tank 163 depending on the operating status of the apparatus 100.

In various embodiments, when the main pump 173 is operational (for example, when the semiconductor manufacturing process performed by the apparatus 100 is running), the circulating mechanism 169 circulates the solution to the directional valve 174 for providing the solution to the main pump 173. In various embodiments, the main pump 173 is monitored and controlled by the controller 500. In various embodiments, the main pump returns the filtered solution to the circulating mechanism 169 via a directional valve 175, for example, when the semiconductor manufacturing process and the main pump 173 goes idle. In various embodiments, when the apparatus 100 is operating, the main pump 173 pumps filtered solution to the semiconductor manufacturing process via a directional valve 176.

In various embodiments, the directional valve 176 provides the solution to a flow meter 177, which monitors, for example, the flow rate and pressure of the solution. In some embodiments, the flow meter 177 provides such measured data to the controller 500, which uses the data to confirm normal operating conditions or to provide an alert when such conditions are abnormal.

In various embodiments, the solution circulated from the flow meter 177 to an air-operated medical/chemical (AMC) control valve 178. The AMC control valve 178 is normally open when the apparatus 100 is operating and closed when the apparatus 100 is idle in various embodiments. In various embodiments, the AMC control valve 178 is controlled and monitored by the controller 500. In such embodiments, when open, the AMC control valve 178 provides the solution to the nozzle 123 of the apparatus 100 during operation of the semiconductor manufacturing process.

In various embodiments, the controller 500 individually controls each of the directional valves 161, 162, 164, 165, 167, 170, 171, 172, 174, 175 and 176. During normal operations, the system 200 is operated as follow, in various embodiments. Directional valves 161, 167 are open during normal operation to admit solution into the filter 168 in some embodiments. For refilling the main pump 173 (and pre-pressurization), valves 174 is open, valve 176 is closed and the remaining valves 170, 171, 172 and 175 are closed in some embodiments. To dispense the solution, the AMC control valve 178 is opened in various embodiments. To vent the pump to the return line, directional valves 172 and 175 are opened, and the remaining valves 174 and 176 are closed in some embodiments.

Figure 2B:
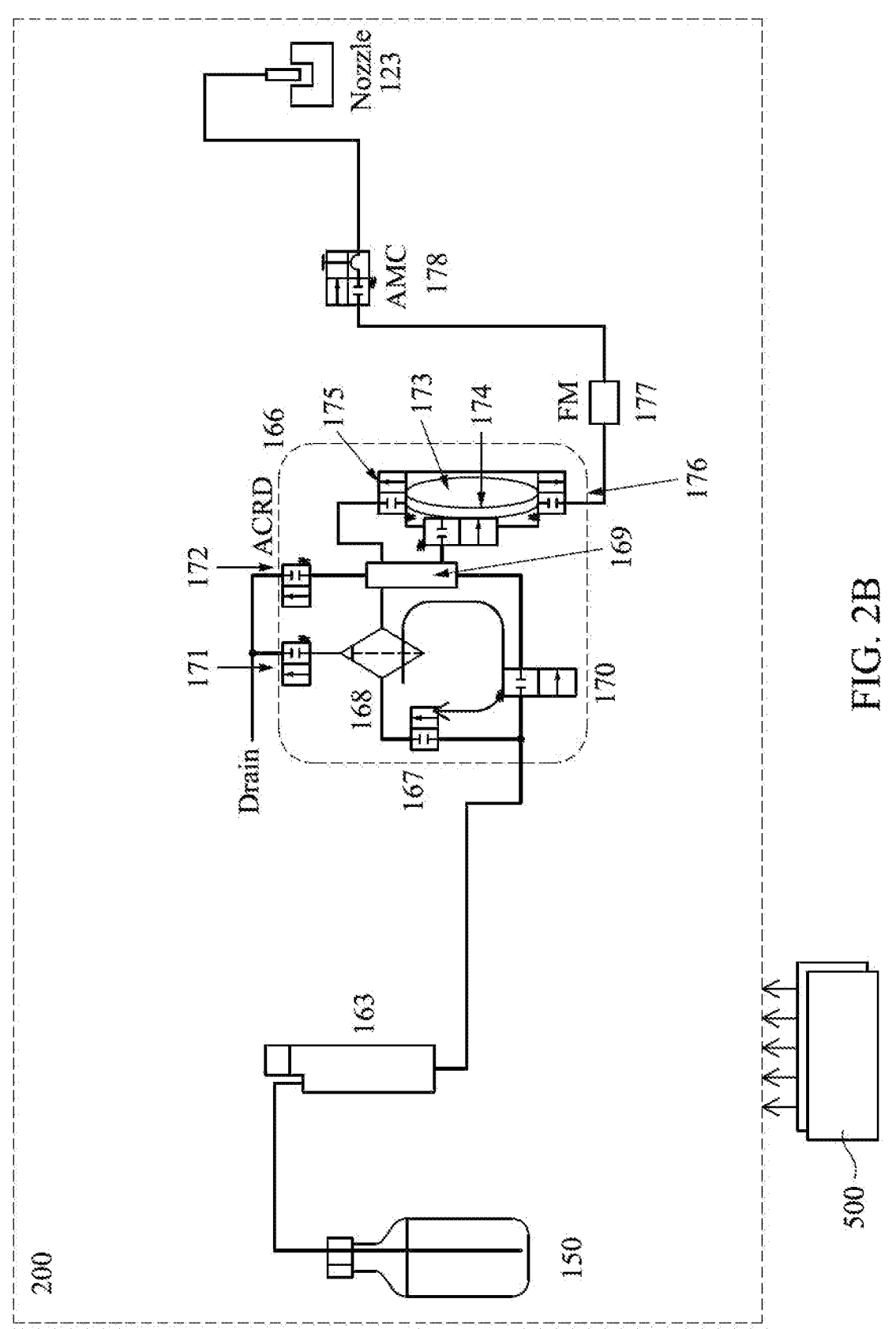
FIG. 2B is a schematic diagram of the first solvent circulation system in accordance with some embodiments.

FIG. 2B is a schematic diagram of the first solution circulation system 200 in accordance with some embodiments. The solution supply 150, tank 163, ACRD pumping system 166, flow meter 177, AMC control valve 178 and nozzle 123 operate as described with respect to FIG. 2A in various embodiments. In the embodiment shown in FIG. 2B, however, the internal recirculation loop remains and the external solution circulation loop is omitted. In such embodiments, the ACRD pumping system 166 vents to a drain via directional valves 171, 172 without a return path to the tank 163.

After extended operation of the apparatus 100, it has been determined that the section of the system 200 from the main pump 173 to the nozzle 123 is often idle, which in turn necessitates a high frequency interval dummy dispense and excessive waste of photoresist or other solution. During idle times, it has been further shown that the internal circulation loop and the external circulation loop are of insufficient capacity to prevent crystallization and concomitant particle generation in the solution due to the idle effect.

Figure 3:
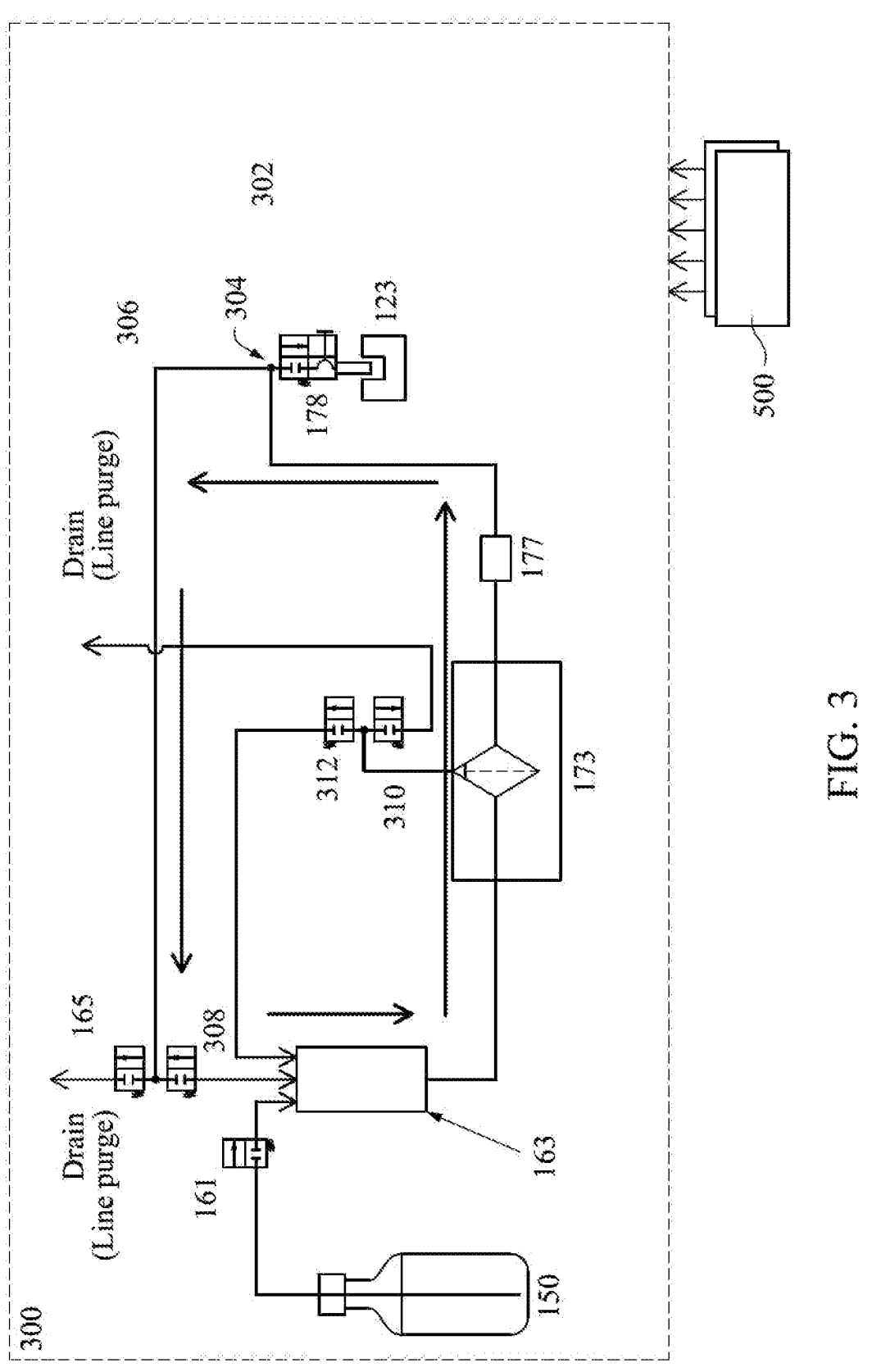
FIG. 3 is a detailed diagram of a second solvent circulation system in accordance with some embodiments.

A larger, extended recirculation loop is added to the foregoing system 200, in some embodiments, to reduce or eliminate semiconductor manufacturing defects. In some embodiments, to accomplish this addition, the AMC control valve 178 is relocated closer to the nozzle 123, and a t-valve 304 is added just before the AMC control valve 178, as shown in FIG. 3. Such a configuration reduces the idle section, and thereby decreases the need for interval dummy and waste of solution.

FIG. 3 is a detailed diagram of a second solution circulation system 300 in accordance with some embodiments, in which the AMC control valve 178 is relocated closer to the nozzle 123, so as to reclaim more solution back to the system 300 in comparison to the system 200. In some embodiments, the idle solution volume is reduced from about 38 cubic centimeters (cc) to about 3 cc due to such relocation.

The solution supply 150, directional valves 161, 165, main pump 173, and flow meter 177 operate as described with respect to FIG. 2A above in various embodiments. In some embodiments, the main pump 173 includes all the components of the ACRD pumping system 166 as described in the foregoing. In some embodiments, the main pump 173 includes an internal filter. Other additions to the system 200, resulting in the system 300 are as follows.

In the system 300, the nozzle 123 includes a solution suck-back device 302 disposed in the tip of the nozzle 123 in various embodiments. In some embodiments, the suck-back device 302 draws solution that would normally be dispensed to the semiconductor manufacturing operation back from the tip of the nozzle 123, in order to be recirculated along the extended recirculation path. In various embodiments, the suck-back device 302 is a vacuum device that is activated whenever the semiconductor manufacturing operation performed by the apparatus 100 goes idle.

Also included in the system 300 is a t-valve 304, which may be any type of valve having one inlet and at least two outlets in various embodiments. As shown in FIG. 3, the t-valve 304 is disposed adjacent to the AMC control valve 178, and between the AMC control valve 178 and the flow meter 177. In various embodiments, the inlet of the t-valve 304 receives solution from the flow meter 177. In some embodiments, a first outlet of the t-valve 304 is connected to the AMC control valve 178 in order to provide solution to the nozzle 123 during normal operation of the apparatus 100. In some embodiments, a second outlet of the t-valve 304 is connected to an extended recirculation conduit 306 in order to create the extended recirculation loop as described. In various embodiments, the controller 500 controls the operation of the t-valve 304 such that the first outlet is open during normal operation of the apparatus 100, and closed during any idle time. In various embodiments, the controller 500 controls the operation of the t-valve 304 such that the second outlet is closed during normal operation of the apparatus 100, and open during any idle time to allow for extended recirculation of the solution.

In various embodiments, the extended recirculation conduit 306 extends between the t-valve 304 and a directional valve 308 that directs the solution back to the tank 163. In such embodiments, the extended recirculation loop is thus formed by solution recirculating from the t-valve 304, through the extended recirculation conduit 306, to the directional valve 308 to the tank 163 and back to the main pump 173 and flow meter 177 before returning to the t-valve 304. In some embodiments, the extended recirculation conduit 306 may direct solution to the directional valve 165 and then to a drain in order to purge solution from the system 300, in advance of maintenance periods and the like of the apparatus 100. In some embodiments, the extended recirculation loop is approximately 50% longer than the external recirculation loop or the internal recirculation loop previously described with respect to the system 200.

In various embodiments, the system 300 includes a directional drain valve 310 disposed between the main pump 173 and a drain in order to purge the main pump 173 during maintenance periods and the like of the apparatus 100.

In various embodiments, the system 300 includes a directional recirculation valve 312 which directs the solution back to the tank 163. In such embodiments, an external recirculation loop, such as that described with respect to FIG. 2A above, is formed such that solution can recirculate between the pump 173 through the directional recirculation valve 312 to the tank 163 before returning to the main pump. The external recirculation loop may be used during idle periods of the apparatus 100 in addition to the extended circulation loop provided by the extended recirculation conduit 306 in order to further preserve the solution and further prevent the solution from forming particles.

Figure 4:
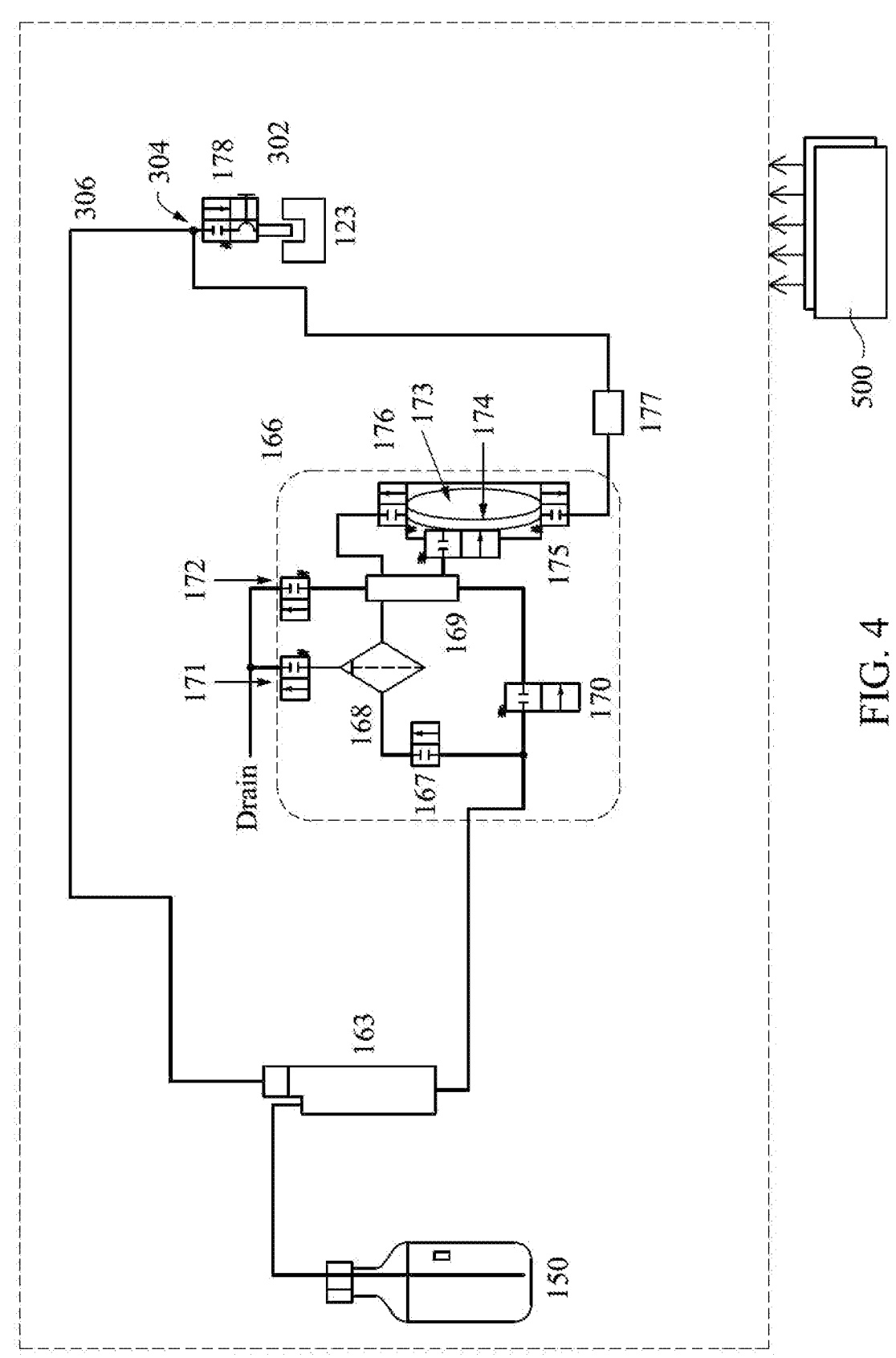
FIG. 4 is a schematic diagram of a second solvent circulation system in accordance with some embodiments.

FIG. 4 is a schematic diagram of a second solvent circulation system 300 in accordance with some embodiments. The ACRD pumping system 166 is shown in detail, including the main pump 173 that was depicted in FIG. 3. The components of the ACRD pumping system 166 shown here operate as described above with respect to FIG. 2A in various embodiments. In some embodiments, the ACRD pumping system 166 includes an internal circulation loop as described with respect to FIG. 2A. In some embodiments, the internal recirculation loop operates in conjunction with one or both of an external recirculation loop and the extended recirculation loop as previously described. In some embodiments, the ACRD pumping system 166 purges to a drain through directional valves 171, 172 and there is no extended recirculation path back to the tank 163.

By providing the extended recirculation loop, which reduces the idle section from the main pump 173 to the nozzle 123, the system 300 enhances the circulation efficiency and reduces the interval dummy frequency, all while maintaining an acceptable defect performance of the apparatus 100. Solution consumption by the interval dummy dispenses are reduced and minimized. Material cost is thereby significantly reduced without sacrificing defect performance. Dummy frequencies are made more flexible and are no longer limited by material cost concerns.

In some embodiments, a length of the conduit from the t-valve 304 (a branching point to the recirculation path) to the AMC control valve 178 is between about 5 cm to about 30 cm. In some embodiments, a volume of the conduit from the t-valve 304 (a branching point to the recirculation path) to the AMC control valve 178 is between about 2 cc to about 15 cc. In some embodiments, the t-valve 304 is located in the housing 101 of FIG. 1. In some embodiments, no valve, branch, filter, measuring device or pump is provided between the t-valve 304 and the AMC control valve 178, and the t-valve 304 and the AMC control valve 178 are directly connected by a single conduit or pipe. In other embodiments, one or more of a valve, branch, filter, measuring device or pump is provided between the t-valve 304 and the AMC control valve 178.

Figures 5A, 5B:
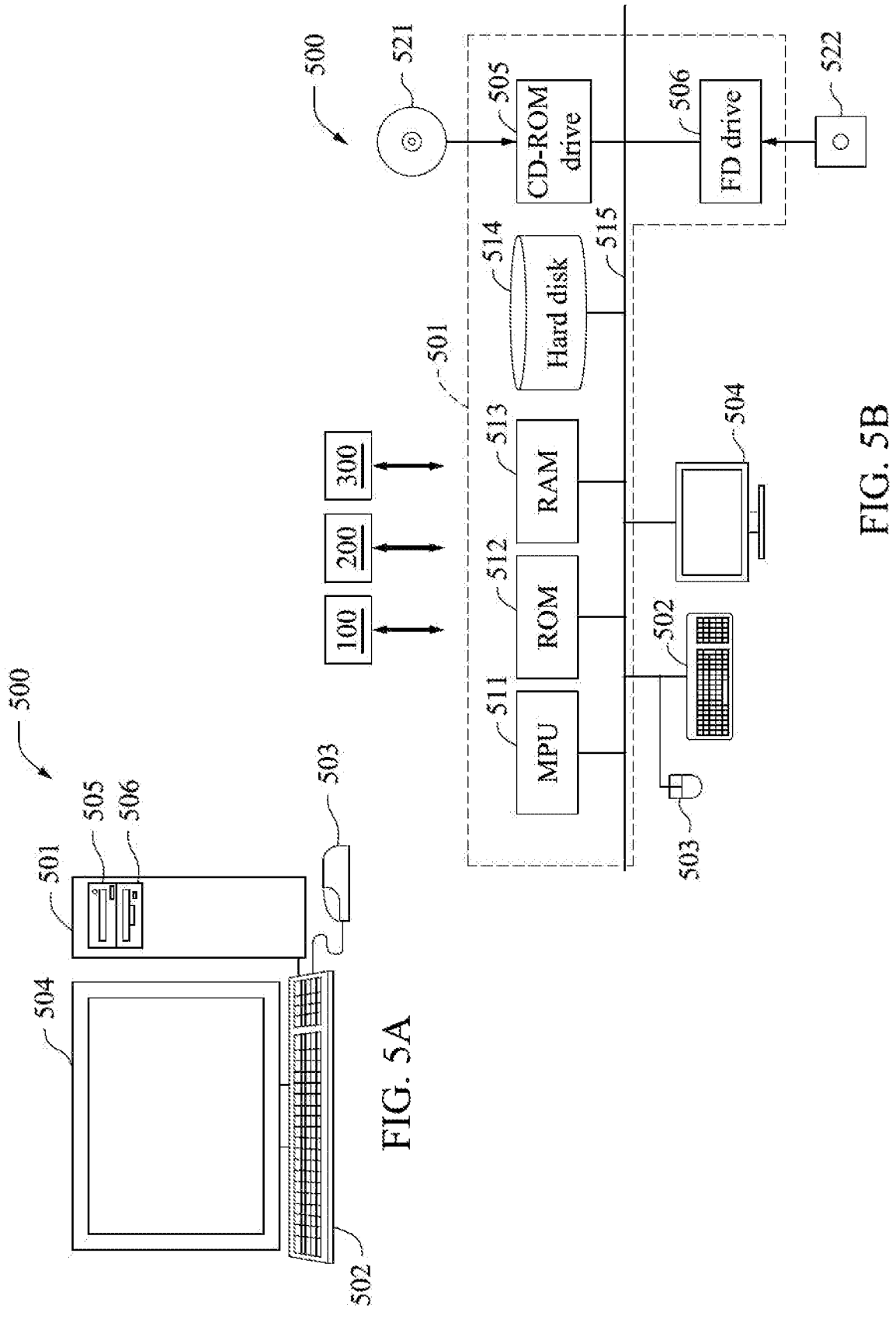
FIG. 5A and FIG. 5B are diagrams of a controller in accordance with some embodiments.

FIG. 5A and FIG. 5B illustrate a controller 500 for controlling the apparatus 100, systems 200, 300 and their components in accordance with various embodiments of the present disclosure. FIG. 5A is a schematic view of a controller 500 that controls the apparatus 100 of FIG. 1. In some embodiments, the controller 500 is programmed to initiate a process for monitoring the apparatus 100, solution dispensing system 200, solution dispensing system 300 and their various components via wireless or hard-wired connections therebetween. Controller 500 provides an alert when abnormal conditions are detected in various embodiments. In some embodiments, manufacturing of semi-conductor devices is halted in response to such an alarm. In some embodiments, a solution purge is initiated in one or more sections of the solution dispensing systems 200, 300. As shown in FIG. 5A, the controller 500 is provided with a computer 501 including an optical disk read only memory (e.g., CD-ROM or DVD-ROM) drive 505 and a magnetic disk drive 506, a keyboard 502, a mouse 503 (or other similar input device), and a monitor 504 in some embodiments FIG. 5B is a diagram showing an internal configuration of the controller 500. In FIG. 5B, an embodiment of the computer 501 is provided with, in addition to the optical disk drive 505 and the magnetic disk drive 506, one or more processors 511, such as a micro-processor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that the computer 501 in various embodiments includes a network card (not shown) for providing a connection to a computer network such as a local area network (LAN), wide area network (WAN) or any other useful computer network for communicating data used by the controller 500 and the apparatus 100.

The program for causing the controller 500 to execute the process for controlling the apparatus 100 of FIG. 1, and components thereof, and/or to execute the method of manufacturing a semiconductor device according to the embodiments disclosed herein, are stored in an optical disk 521 or a magnetic disk 522, which is inserted into the optical disk drive 505 or the magnetic disk drive 506, and transmitted to the hard disk 514 in some embodiments. Alternatively, the program may be transmitted via a network (not shown) to the controller 500 and stored in the hard disk 514. At the time of execution, the program is loaded into the RAM 513 in some embodiments. The program may be loaded from the optical disk 521 or the magnetic disk 522, or directly from a network.

The stored programs do not necessarily have to include, for example, an operating system (OS) or a third party program to cause the computer 501 to execute the processes disclosed herein. In various embodiments, the program only includes a command portion to call an appropriate function (module) in a controlled mode and obtain desired results in some embodiments. In various embodiments described herein, the controller 500 is in communication with the apparatus 100 to control various functions thereof, including the systems 200, 300.

The controller 500 can be configured to provide control data to those system components and receive process and/or status data from those system components. For example, the controller 500 comprises a microprocessor, a memory (e.g., volatile or non-volatile memory), and a digital I/O port capable of generating control voltages sufficient to communicate and activate inputs to the processing system 100, as well as monitor outputs from the processing system 100. Moreover, the controller 500 exchanges information with the apparatus 100 and systems 200, 300. In addition, a program stored in the memory is utilized to control the aforementioned components of the apparatus 100 according to a process recipe in some embodiments. Furthermore, in some embodiments, the controller 500 is configured to analyze the process and/or status data, to compare the process and/or status data with target process and/or status data, and to use the comparison to change a process and/or control a system component. In addition, the controller 500 is configured to analyze the process and/or status data, to compare the process and/or status data with historical process and/or status data, and to use the comparison to predict, prevent, and/or declare a fault or alarm in some embodiments.

FIG. 6 is a flow chart of a recirculation process 600 in accordance with some embodiments. In some embodiments, the process 600 is controlled and maintained by the controller 500. At operation 602, the solution is circulated from the main pump 173 to the inlet of the t-valve 304. Next, at operation 603, when the outlet of the t-valve 304 connected to the nozzle 123 is open, the solution circulates through the AMC control valve 178 to the nozzle 123 (operation 604) in order to dispense the solution for use in the semiconductor manufacturing operation performed by the apparatus 100 (operation 606). A suck-back device 302 may be operated as necessary semiconductor manufacturing operations.

If the outlet of the t-valve 304 connected to the nozzle 123 is closed at operation 603, the process 600 instead continues to operation 608. When an outlet of the t-valve 304 connected to the extended recirculation conduit 306 is open, the controller 500 determines whether too much time has passed since solution was dispensed by the nozzle (operation 613) such that recirculation of the solution through the extended recirculation loop will no longer sufficiently prevent excessive particle generation therein. If so, the process 600 continues to operation 614 where an interval dummy dispense of the nozzle 123 is initiated by the controller 500, after which the process 600 returns to operation 613 above. If not, the process 600 continues to operation 615, where the solution is recirculated back to the main pump 173 via the extended circulation conduit 306 and then the tank 163 in some embodiments.

If a malfunction occurs at operation 608, such that neither outlet of the t-valve 304 is open, then an alarm is generated by the controller 500 (operation 610) and semiconductor manufacturing operations performed by the apparatus 100 are halted (operation 612) in various embodiments. In some embodiments, the solution is drained from one or more sections or components of the system 300 in response to such an alarm, either immediately or after a threshold time period.

As demonstrated in the foregoing, an extended recirculation loop reduces the idle section from the main pump 173 pump to a dispense nozzle 123. In various embodiments, a t-valve 304 is included there-between. In various embodiments, the AMC control valve 178 is located close to the nozzle 123. Embodiments of the disclosure have enhanced circulation efficiency and provide a lower frequency of interval dummy dispenses while inhibiting defect generation 1. Solution consumption during the interval dummy dispenses is minimized and material cost is significantly reduced.

According to various embodiments, an apparatus includes a tank that supplies a solution for a semiconductor manufacturing process. A pump receives the solution from the tank. A valve that has a first outlet, a second outlet, receives the solution from the pump through an inlet. A control valve selectively distributes the solution from the first outlet to a nozzle that receives the solution from the control valve and dispenses the solution for the semiconductor manufacturing process. An extended circulation conduit re-circulates any unused solution from the second outlet back to the tank. In some embodiments, the nozzle further has a vacuum for collecting and reclaiming solution from a tip of the nozzle when the semiconductor manufacturing process is idle. In some embodiments, a controller selectively opens and closes the first outlet and the second outlet. In some embodiments, a flow meter disposed between the pump and the valve. In some embodiments, the valve is a t-valve. In some embodiments, a first recirculation loop circulates the solution between the pump and the tank. In some embodiments, the first recirculation loop circulates the solution between the pump and a filter. In some embodiments, the first recirculation loop includes at least one directional valve disposed between the filter and the pump. In some embodiments, a second recirculation loop circulates the solution from the tank to the pump to the valve and along the extended recirculation conduit back to the tank.

According to various embodiments, an apparatus includes a tank that supplies a solution for a semiconductor manufacturing process. A pump receives the solution from the tank. The pump has a circulating mechanism for circulating the solution around a first recirculation loop. The pump also has a pump outlet for circulating the solution to the semiconductor manufacturing process. A valve has an inlet that receives the solution from the pump outlet. The valve further has a first outlet and a second outlet. The solution is supplied to the semiconductor manufacturing process from the first outlet. An extended circulation conduit re-circulates the solution from the second outlet back to the tank along a second recirculation loop. In some embodiments, a control valve selectively distributes the solution from the first outlet to the semiconductor manufacturing process. In some embodiments, a nozzle receives the solution from the control valve and dispenses the solution for use by the semiconductor manufacturing process. In some embodiments, the first recirculation loop recirculates the solution from the pump back to the tank. In some embodiments, the first circulation loop recirculates the solution from the pump through a filter and then back to the pump. In some embodiments, the first circulation loop comprises a circulating mechanism disposed between the pump and the filter. In some embodiments, a controller selectively opens and closes the first outlet and the second outlet. In some embodiments, a flow meter is disposed between the pump and the valve. In some embodiments, the valve is a t-valve.

According to various embodiments, a method includes circulating a solution from a tank using a pump and receiving the solution from the pump at an inlet of a valve. When a manufacturing operation occurs, the solution is directed to a first outlet of the valve, which is connected to a nozzle used in the manufacturing process. When the manufacturing operation is idle, the solution is directed to a second outlet connected to an extended recirculation path. The solution is re-circulated back to the tank via the extended recirculation path for re-use in the manufacturing operation. In some embodiments, a control valve disposed between the second outlet and the nozzle is activated in order to provide the solution to the manufacturing operation. In some embodiments, the solution is circulated in a second circulation path between the pump and a filter when the manufacturing operation is idle.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a tank that supplies a solution for a semiconductor manufacturing process;
   a pump that receives the solution from the tank;
   a first valve having a first outlet, a second outlet, and an inlet that receives the solution from the pump;
   an air-operated medical/chemical (AMC) control valve that selectively distributes the solution from the first outlet;
   a nozzle that receives the solution from the control valve and dispenses the solution for the semiconductor manufacturing process; and
   a circulation conduit that re-circulates unused solution from the second outlet to the tank,
   wherein the AMC control valve is arranged between the first valve and the nozzle, and
   the AMC control valve and the first valve are connected to each other by a conduit having a length of from 5 to 30 cm.

2. The apparatus of claim 1, wherein the nozzle further comprises a vacuum for collecting solution from a tip of the nozzle when the semiconductor manufacturing process is idle.

3. The apparatus of claim 1, further comprising a controller for selectively opening and closing the first outlet and the second outlet.

4. The apparatus of claim 1, further comprising a flow meter disposed between the pump and the first valve.

5. The apparatus of claim 1, wherein the first valve is a t-valve.

6. The apparatus of claim 1, further comprising a first recirculation loop that circulates the solution between the pump and the tank.

7. The apparatus of claim 1, further comprising a first recirculation loop that circulates the solution between the pump and a filter.

8. The apparatus of claim 7, the first recirculation loop further comprising at least one directional valve disposed between the filter and the pump.

9. The apparatus of claim 6, further comprising a second recirculation loop from the tank to the pump to the first valve and along the circulation conduit back to the tank.

10. An apparatus comprising:

a tank that supplies a solution for a semiconductor manufacturing process;

a pump that receives the solution from the tank, the pump having a fluid circulator for circulating the solution around a first recirculation loop, the pump further having a pump outlet for circulating the solution to the semiconductor manufacturing process;

a first valve having an inlet that receives the solution from the pump outlet, the first valve further having a first outlet and a second outlet, wherein the solution is supplied to the semiconductor manufacturing process from the first outlet;

a control valve that selectively distributes the solution from the first outlet to the semiconductor manufacturing process;

a circulation conduit that re-circulates the solution from the second outlet back to the tank along a second recirculation loop, and a directional drain valve arranged in the circulation conduit between the tank and the second outlet, the directional drain valve configured to drain the solution from the apparatus, wherein the control valve is connected to the first valve by a conduit having a length of from 5 to 30 cm.

11. The apparatus of claim 10, wherein the control valve is an air-operated medical/chemical (AMC) control valve.

12. The apparatus of claim 10, further comprising a nozzle that receives the solution from the control valve and dispenses the solution for the semiconductor manufacturing process.

13. The apparatus of claim 10, wherein the first recirculation loop recirculates the solution from the pump back to the tank.

14. The apparatus of claim 10, wherein the first recirculation loop recirculates the solution from the pump through a filter and then back to the pump.

15. The apparatus of claim 14, wherein the fluid circulator is disposed between the pump and the filter.

16. The apparatus of claim 10, further comprising a controller for selectively opening and closing the first outlet and the second outlet.

17. The apparatus of claim 10, wherein the first valve is a t-valve.

18. An apparatus comprising:

a pump;

a first valve;

a circulation conduit;

a tank configured to supply a solution to the pump, wherein the pump is configured to:

receive the solution from the tank;

circulate the solution around a first recirculation loop; and supply the solution to the first valve, wherein the first valve has an inlet configured to receive the solution from the pump, a first outlet configured to supply the solution to a photolithography apparatus, and a second outlet configured to supply the solution to the circulation conduit configured to re-circulate the solution from the second outlet back to the tank along a second recirculation loop;

a control valve configured to selectively distribute the solution from the first outlet to the photolithography apparatus;

a controller configured to control the first valve, the control valve, and the pump, and a directional drain valve arranged in the circulation conduit between the tank and the second outlet, the directional drain valve configured to drain the solution from the apparatus, wherein a conduit connecting the control valve to the first valve has a length of 5 cm to 30 cm.

19. The apparatus of claim 18, wherein the control valve is an air-operated medical/chemical (AMC) control valve.

20. The apparatus of claim 18, further comprising a filter disposed in the first recirculation loop.

* * * * *